United States Patent
Lin

(10) Patent No.: US 8,455,970 B2
(45) Date of Patent: Jun. 4, 2013

(54) LEAD FRAME ASSEMBLY, PACKAGE STRUCTURE AND LED PACKAGE STRUCTURE

(75) Inventor: Chen-Hsiu Lin, Taipei (TW)

(73) Assignees: Silitek Electronic (Guangzhou) Co., Ltd., Guangzhou (CN); Lite-On TECHNOLOGY Corp., Taipei (TW)

(*) Notice: Subject to any disclaimer, the term of this patent is extended or adjusted under 35 U.S.C. 154(b) by 573 days.

(21) Appl. No.: 12/654,947

(22) Filed: Jan. 11, 2010

(65) Prior Publication Data
US 2010/0213484 A1    Aug. 26, 2010

(30) Foreign Application Priority Data
Feb. 26, 2009 (CN) .......................... 2009 1 0037562

(51) Int. Cl.
*H01L 31/0203* (2006.01)
*H01L 23/495* (2006.01)

(52) U.S. Cl.
USPC ............. 257/433; 257/666; 257/784; 257/98; 257/100; 257/E25.032

(58) Field of Classification Search
USPC .................. 257/666, 784, 98, 100, 432, 433, 257/E25.032
See application file for complete search history.

(56) References Cited

U.S. PATENT DOCUMENTS

| | | | | |
|---|---|---|---|---|
| 3,924,246 | A * | 12/1975 | Scherer | 365/94 |
| 4,710,797 | A * | 12/1987 | Tanaka | 257/681 |
| 5,068,713 | A * | 11/1991 | Toda | 257/680 |
| 5,291,038 | A * | 3/1994 | Hanamoto et al. | 257/82 |
| 6,066,861 | A | 5/2000 | Hohn et al. | |
| 6,340,824 | B1 * | 1/2002 | Komoto et al. | 257/99 |
| 6,417,019 | B1 | 7/2002 | Mueller et al. | |
| 6,576,488 | B2 | 6/2003 | Collins, III et al. | |
| 6,621,616 | B1 * | 9/2003 | Bauer et al. | 359/273 |
| 7,129,638 | B2 | 10/2006 | Ng | |
| 7,408,205 | B2 * | 8/2008 | Webster et al. | 257/99 |
| 7,695,990 | B2 * | 4/2010 | Sorg et al. | 438/26 |
| 7,728,507 | B2 * | 6/2010 | Winter et al. | 313/498 |
| 7,838,899 | B2 * | 11/2010 | Chow et al. | 257/100 |
| 2007/0108561 | A1 * | 5/2007 | Webster et al. | 257/666 |
| 2009/0173957 | A1 * | 7/2009 | Brunner et al. | 257/98 |

* cited by examiner

*Primary Examiner* — Nitin Parekh
(74) *Attorney, Agent, or Firm* — Rosenberg, Klein & Lee

(57) ABSTRACT

A package structure is adapted for mounting at least one light emitting diode (LED) die. The package structure includes an insulating housing having a top surface that is formed with a cavity, and a lead frame unit. The lead frame unit includes a first lead frame portion and a second lead frame portion. The first lead frame portion is covered by the insulating housing, and has a die-bonding area exposed within the cavity and adapted for mounting the LED die. The second lead frame portion is covered by the insulating housing, and has a conductive surface exposed outwardly of the top surface of the insulating housing and adapted for electrical connection with an end of a conductive wire.

15 Claims, 5 Drawing Sheets

LEAD FRAME ASSEMBLY, PACKAGE STRUCTURE AND LED PACKAGE STRUCTURE

CROSS-REFERENCE TO RELATED APPLICATION

This application claims priority of Chinese Patent Application No. 200910037562.2, filed on Feb. 26, 2009.

BACKGROUND OF THE INVENTION

1. Field of the Invention

The invention relates to a lead frame assembly, more particularly to a lead frame assembly adapted for mounting light emitting diode (LED) dies, and a package structure having a lead frame unit of the lead frame assembly.

2. Description of the Related Art

Referring to FIG. 1, a conventional LED package structure 9 comprises a housing 92 formed with a cavity 921, and an LED die 91 mounted in the cavity 921. A conductive wire 93 has one end connected to the LED die 91, and the other end connected to a terminal 94 disposed in the cavity 921. The dimensions of the cavity 921 must be large enough to permit a wire binder (not shown) to be placed therein. However, such a large cavity 921 increases the thickness of the housing 92 and the size of the LED package structure 9. Furthermore, after an encapsulating material 95 is filled in the cavity 921, light emitted by the LED die 91 and transmitted through the encapsulating material 95 cannot provide uniform illumination.

Referring to FIG. 2, an LED package structure 8 comprises a housing 81 formed with a cavity 811, and two conductive wires 82. The housing 81 is made of ceramic material, and each of the conductive wires 82 has one end connected to a top surface of the housing 81 such that operation of a wire binder (not shown) is not limited to the dimension of the cavity 811. However, the housing 81 of the LED package structure 8 made of ceramic material may result in a troublesome manufacturing process and an expensive manufacturing cost.

SUMMARY OF THE INVENTION

Therefore, the object of the present invention is to provide a package structure and an LED package structure capable of alleviating the above drawbacks of the prior art.

According to an aspect of the present invention, a package structure adapted for mounting at least one light emitting diode (LED) die comprises an insulating housing and a lead frame unit. The insulating housing has a top surface that is formed with a cavity. The lead frame unit includes a first lead frame portion and a second lead frame portion. The first lead frame portion is covered by the insulating housing, and has a die-bonding area exposed within the cavity and adapted for mounting the LED die. The second lead frame portion is covered by the insulating housing, and has a conductive surface exposed outwardly of the top surface of the insulating housing and adapted for electrical connection with one end of a conductive wire.

According to another aspect of the present invention, a light emitting diode (LED) package structure comprises an insulating housing having a top surface that is formed with a cavity, an LED die, and a lead frame unit. The lead frame unit includes a first lead frame portion and a second lead frame portion. The first lead frame portion is covered by the insulating housing and has a die-bonding area exposed within the cavity and adapted for mounting the LED die. The second lead frame portion is covered by the insulating housing, and has a conductive surface exposed outwardly of the top surface of the insulating housing and disposed higher than the LED die. At least one conductive wire has one end connected fixedly to the conductive surface of the second lead frame portion, and the other end extending into the cavity of the insulating housing and connected fixedly to the LED die. An encapsulating material is filled in the cavity of the insulating housing for covering the LED die.

According to still another aspect of the present invention, a lead frame assembly comprises a plurality of lead frame units connected to each other. Each of the lead frame units includes a first lead frame portion, a second lead frame portion, a pair of first side strips, a pair of second side strips, and a plurality of connecting strips. The first lead frame portion has a die-bonding area adapted for mounting a light emitting diode (LED) die. The second lead frame portion has a conductive surface that is higher than remaining portions thereof, and that is adapted for electrical connection with a conductive wire. For each of the lead frame units, the first side strips are arranged in a first direction, are aligned with and spaced apart from each other, and flank the first lead frame portion and the second lead frame portion. Also, for each of the lead frame units, the second side strips are arranged in a second direction different from the first direction, are aligned with and spaced apart from each other, and flank the first lead frame portion and the second lead frame portion. Moreover, for each of the lead frame units, each of the second side strips is connected between the first side strips. In addition, for each of the lead frame units, the connecting strips connect the first lead frame portion and the second lead frame portion with the first side strips.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 3:
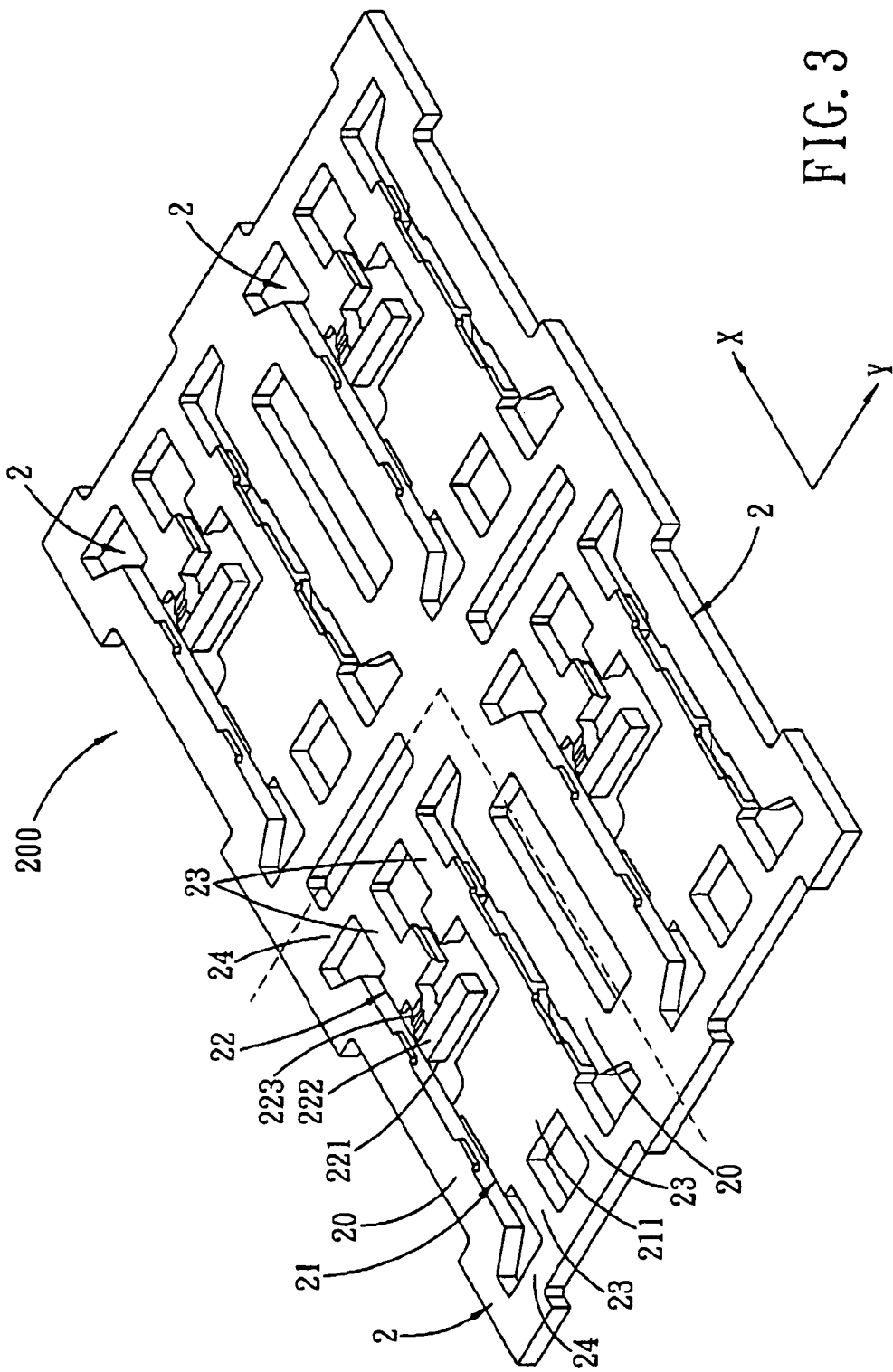
FIG. 3 is a perspective view of a preferred embodiment of a plurality of lead frame units of the present invention, each of the lead frame units including a first lead frame portion, a second lead frame portion, a pair of first side strips, a pair of second side strips, and a plurality of connecting strips.

As shown in FIG. 3, a preferred embodiment of a lead frame assembly 200 according to the present invention comprises a plurality of lead frame units 2 connected to each other. Each of the lead frame units 2 includes a first lead frame portion 21, a second lead frame portion 22, a pair of first side strips 24, a pair of second side strips 20, and a plurality of connecting strips 23. The first side strips 24 of each of the lead frame units 2 are arranged in a first direction (X), and are aligned with and spaced apart from each other. The first side strips 24 of each of the lead frame units 2 extend along a second direction (Y) different from the first direction (X), and flank the first and second lead frame portions 21, 22 of a corresponding one of the lead frame units 2. The second side strips 20 of each of the lead frame units 2 are arranged in the second direction (Y), are aligned with and spaced apart from each other, and flank the first and second lead frame portions 21, 22 of a corresponding one of the lead frame units 2. Each of the second side strips 20 of each of the lead frame units 2 is connected between the first side strips 24 of a corresponding one of the lead frame units 2. The connecting strips 23 of each of the lead frame units 2 connect the first lead frame portion 21 and the second lead frame portion 22 of a corresponding one of the lead frame units 2 with the first side strips 24 of the corresponding one of the lead frame units 2. Any two adjacent ones of the lead frame units 2 have two interconnected first side strips 24 or two interconnected second side strips 20 that are formed with each other.

The configurations of the lead frame units 2 are substantially the same. Therefore, only one of the lead frame units 2 will be described in the following.

Figure 5:
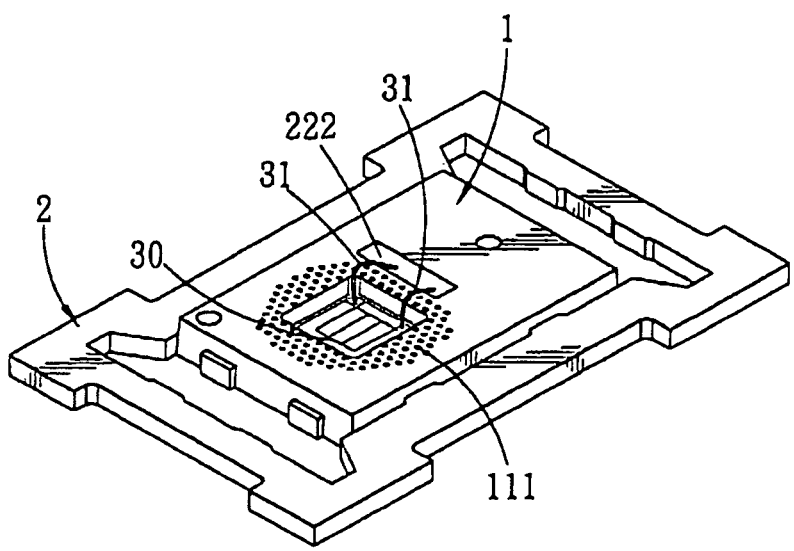
FIG. 5 is a perspective view of one of the lead frame units of the preferred embodiment without the connecting strips, and of the insulating housing, a light emitting diode (LED) die, and two conductive wires, illustrating the LED die mounted on the lead frame unit, and the conductive wires bonded to the LED die and the second lead frame portion.
Figure 6:
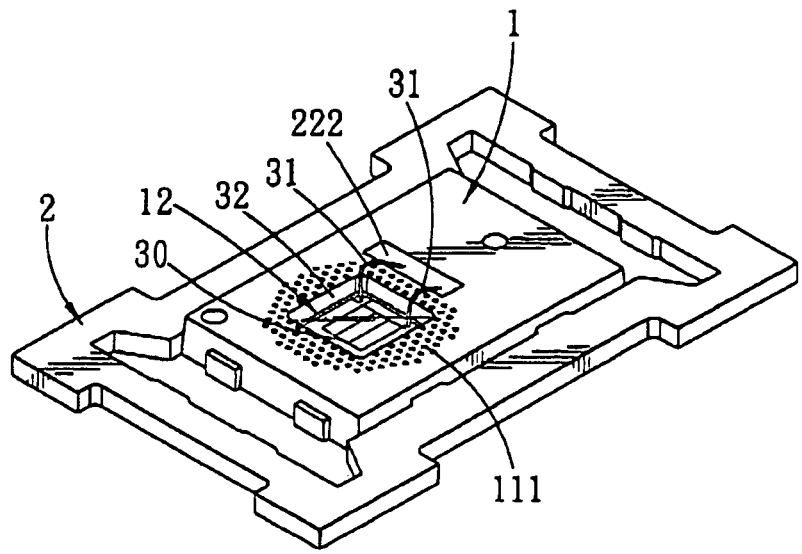
FIG. 6 is a view similar to FIG. 5, but illustrating a cavity of the insulating housing filled with an encapsulating material.

The first lead frame portion 21 of the lead frame unit 2 has a die-bonding area 211 adapted for mounting a light emitting diode (LED) die 30 (shown in FIG. 5). The second lead frame portion 22 of the lead frame unit 2 has a conductive portion 221, a conductive surface 222, and a bent portion 223. In this preferred embodiment, the conductive surface 222 of the second lead frame portion 22 constitutes a top surface of the conductive portion 221 of the second lead frame portion 22. The bent portion 223 is bent upwardly to connect with the conductive portion 221 such that the conductive surface 222 is disposed higher than the LED die 30 when the lead frame unit 2 is disposed on a horizontal surface such that the conductive surface 222 faces upwardly.

Figure 4:
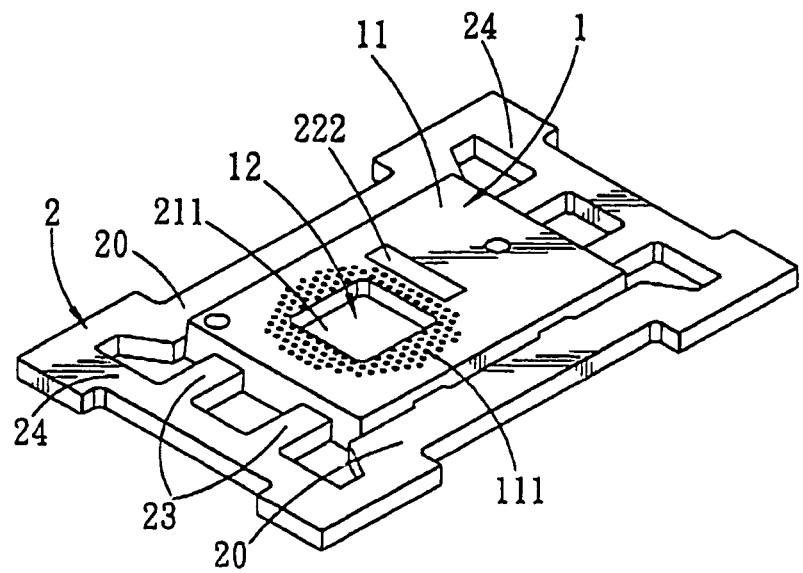
FIG. 4 is a perspective view of one of the lead frame units of the preferred embodiment and an insulating housing.

As shown in FIG. 4, when it is desired to form an LED package structure 300 (see FIG. 7), an insulating housing 1 is molded on the lead frame unit 2. The second side strips 20 of the lead frame unit 2 extend into the insulating housing 1 to connect to the second side strips 20, which is advantageous for subsequent manufacturing process. The insulating housing 1 has a top surface 11 that is formed with a cavity 12. A plastic material, such as epoxy resin or silica gel, is injected onto the lead frame unit 2 to form the insulating housing 1 in an in-mold injection manner. The first lead frame portion 21 and the second lead frame portion 22 (see FIG. 3) of the lead frame unit 2 are covered by the insulating housing 1. The die-bonding area 211 (see FIG. 3) of the first lead frame portion 21 of the lead frame unit 2 is exposed within the cavity 12 of the insulating housing 1 and is adapted for mounting the LED die 30 (see FIG. 5).

The conductive surface 222 of the second lead frame portion 22 of the lead frame unit 2 and the top surface 11 of the insulating housing 1 are located in a plane. It should be noted that the conductive surface 222 of the second lead frame portion 22 may be disposed higher than the top surface 11 of the insulating housing 1 in other preferred embodiments. As such, the conductive surface 222 of the second lead frame portion 22 of the lead frame unit 2 is exposed outwardly of the top surface 11 of the insulating housing 1 and can be adapted for electrical connection with conductive wires 31 (see FIG. 5). The top surface 11 of the insulating housing 1 has a rough portion 111 surrounding the cavity 12 of the insulating housing 1. In this preferred embodiment, the rough portion 111 is formed with a plurality of protrusions.

Referring to FIGS. 5 to 9, to proceed to form the LED package structure 300, after the insulating housing 1 is molded on the lead frame unit 2, the connecting strips 23 (see FIG. 4) can be removed from the lead frame unit 2. The conductive wires 31 are bonded to the first and second lead frame portions 21, 22 (shown in FIG. 3), such that each of the conductive wires 31 has one end connected fixedly to the conductive surface 222 of the second lead frame portion 22, and the other end extending into the cavity 12 of the insulating housing 1 and connected fixedly to an electrode contact (not shown) of the LED die 30. The cavity 12 of the insulating housing 1 is rectangular and is defined by an inner surface 120. In this preferred embodiment, the LED die 30 is rectangular, and the inner surface 120 defining the cavity 12 is substantially vertical and has a light reflection property. A distance between the LED die 30 and the inner surface 120 is smaller than 0.6 mm. Light emitted by the LED die 30 has a wavelength that is between ultraviolet and infrared ray.

Figure 7:
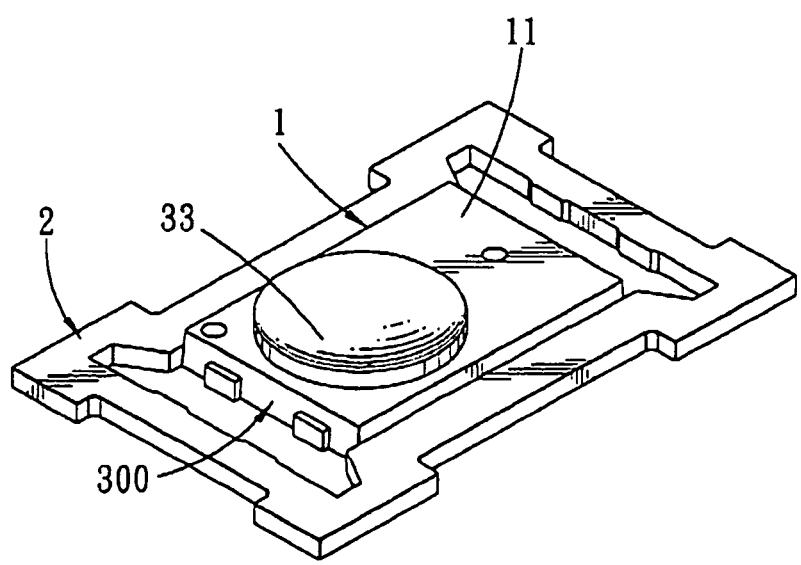
FIG. 7 is a perspective view of an LED package structure including one of the lead frame units of the preferred embodiment without the connecting strips, and including the insulating housing, the LED die, the conductive wires, and an optical lens, illustrating the optical lens disposed on a top surface of the insulating housing for covering the encapsulating material.

The LED package structure 300 further comprises an encapsulating material 32 (see FIG. 6) and an optical lens 33 (see FIG. 7). The encapsulating material 32 is filled in the cavity 12 of the insulating housing 1, covers the LED die 30, and includes fluorescent powders that convert light emitted by the LED die 30 so as to output uniform illumination. The optical lens 33 is disposed on the top surface 11 of the insulating housing 1 for covering the encapsulating material 32 and the rough portion 111 of the insulating housing 1. Due to the presence of the rough portion 111 of the insulating housing 1, a contact area between the insulating housing 1 and the optical lens 33 of the LED package structure 300 is increased, thus providing a firm connection between the insulating housing 1 and the optical lens 33. In this preferred embodiment, the encapsulating material 32 and the optical lens 33 are made of the same material.

Figure 8:
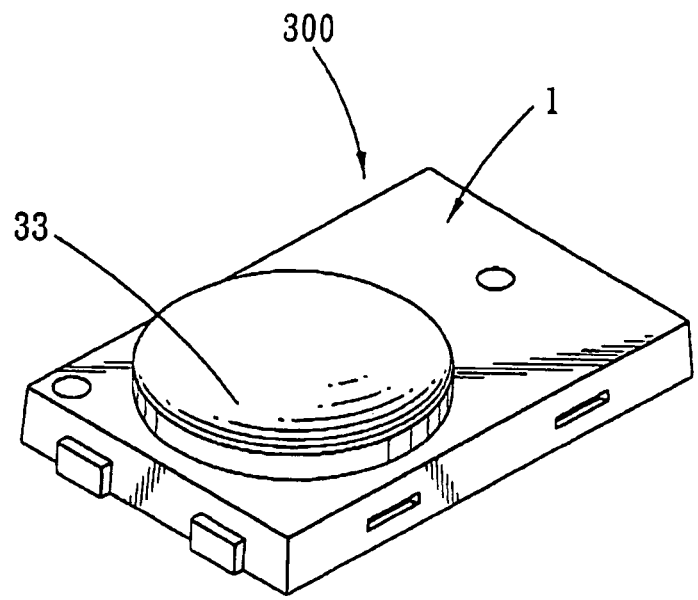
FIG. 8 is a perspective view of the LED package structure.
Figure 9:
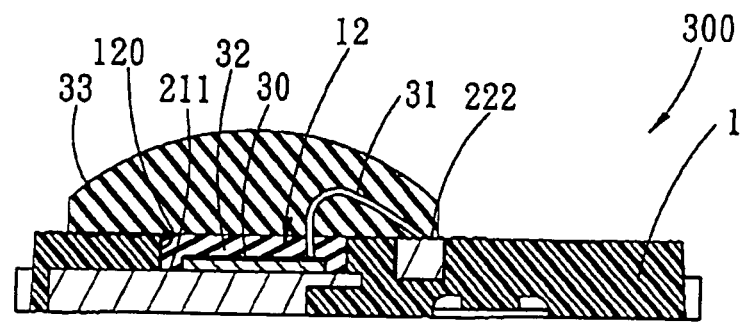
FIG. 9 is a sectional view of the LED package structure.

Subsequent to connection between the optical lens 33 and the insulating housing 1, referring to FIG. 8, the first and second side strips 24, 20 of the lead frame unit 2 (shown in FIG. 4) are removed. It should be noted that the configuration of the lead frame unit 2 is not limited to this preferred embodiment, as long as a portion of one of the first and second lead frame portions 21, 22 is disposed higher than the LED die 30 and is exposed outwardly of the top surface 11 of the insulating housing 1 to allow the conductive wires 31 to be bonded to the conductive surface 222 and the LED die 30.

Figure 1:
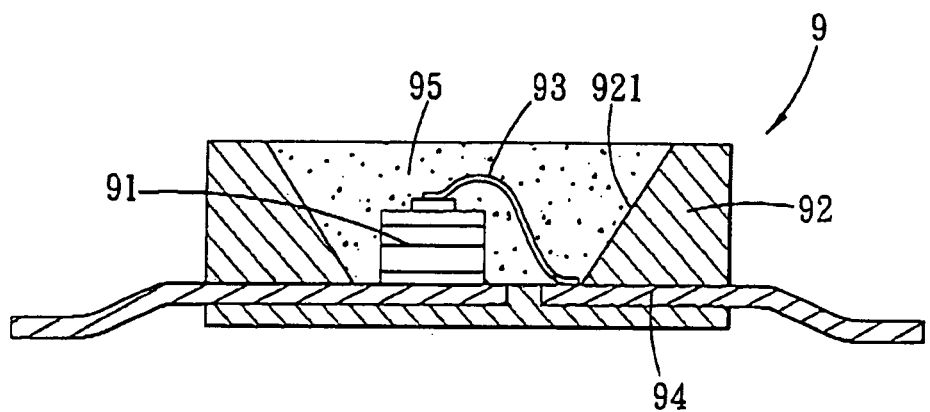
FIG. 1 is a sectional view of a conventional LED package structure.
Figure 2:
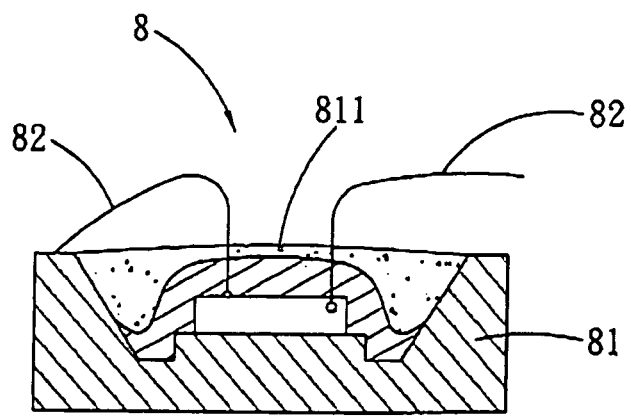
FIG. 2 is a sectional view of another conventional LED package structure.

To sum up, the advantages of the LED package structure 300 according to the present invention are as outlined in the following. The conductive portion 221 of the second lead frame portion 22 of the lead frame unit 2 is exposed outwardly of the insulating housing 1. Therefore, it is convenient to bond the conductive wires 31 to the lead frame unit 2 without increasing the dimensions of the cavity 12 of the insulating housing 1. As a result, the thickness of the encapsulating material 32 is decreased as compared to that of the conventional LED package structure 9 (see FIG. 1), such that light emitted by the LED die 30 is transmitted into the encapsulating material 32 to reach the fluorescent powders within a short time, and is converted by the fluorescent powders to output uniform illumination. Furthermore, since the plastic material, such as epoxy resin or silica gel, is injected onto the lead frame unit 2 to form the insulating housing 1 in an in-mold injection manner, as described above, the LED package structure 300 of the present invention is easier to fabricate and the manufacturing costs are decreased as compared to the conventional LED package structure 8 that employs a ceramic housing 81.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A package structure adapted for mounting at least one light emitting diode (LED) die, said package structure comprising:
   an insulating housing having a top surface that is formed with a cavity; and
   a lead frame unit including:
   a first lead frame portion covered by said insulating housing, and having a die-bonding area exposed within said cavity and adapted for mounting said LED die, and
   a second lead frame portion covered by said insulating housing, and having a conductive surface exposed through a portion of said top surface of said insulating housing offset from a bottom surface of said cavity and adapted for electrical connection with an end of a conductive wire.

2. The package structure as claimed in claim 1, wherein said top surface of said insulating housing has a rough portion surrounding said cavity of said insulating housing.

3. The package structure as claimed in claim 1, wherein said lead frame unit further includes:
   a pair of first side strips arranged in a first direction, aligned with and spaced apart from each other, and flanking said first lead frame portion and said second lead frame portion;
   a pair of second side strips arranged in a second direction different from the first direction, aligned with and spaced apart from each other, extending into said insulating housing, and flanking said first lead frame portion and said second lead frame portion, each of said second side strips being connected between said first side strips; and
   a plurality of connecting strips connecting said first lead frame portion and said second lead frame portion with said first side strips,
   whereby, after said insulating housing is molded on said lead frame unit, said connecting strips are removable from said lead frame unit.

4. A package structure, adapted for mounting at least one light emitting diode (LED) die, said package structure comprising:
   an insulating housing having a top surface that is formed with a cavity; and
   a lead frame unit including:
   a first lead frame portion covered by said insulating housing, and having a die-bonding area exposed within said cavity and adapted for mounting said LED die, and
   a second lead frame portion covered by said insulating housing, and having a conductive surface exposed outwardly through said top surface of said insulating housing and adapted for electrical connection with an end of a conductive wire;
   wherein said conductive surface of said second lead frame portion and said top surface of said insulating housing are located in a plane.

5. The package structure as claimed in claim 4, wherein said second lead frame portion further has a conductive portion and a bent portion bent upwardly to connect with said conductive portion such that said conductive surface is disposed higher than said LED die, said conductive surface of said second lead frame portion constituting a top surface of said conductive portion.

6. A light emitting diode (LED) package structure comprising:
   an insulating housing having a top surface that is formed with a cavity;
   an LED die;
   a lead frame unit including:
   a first lead frame portion covered by said insulating housing and having a die-bonding area exposed within said cavity said LED die, and
   a second lead frame portion covered by said insulating housing, and having a conductive surface exposed through a portion of said top surface of said insulating housing offset from a bottom surface of said cavity and disposed higher than said LED die;
   at least one conductive wire having one end connected fixedly to said conductive surface of said second lead frame portion, and the other end extending into said cavity of said insulating housing and connected fixedly to said LED die; and
   an encapsulating material filled in said cavity of said insulating housing for covering said LED die.

7. The LED package structure as claimed in claim 6, wherein said conductive surface of said second lead frame portion and said top surface of said insulating housing are located in a plane.

8. The LED package structure as claimed in claim 7, wherein said second lead frame portion further has a conductive portion and a bent portion bent upwardly to connect with said conductive portion such that said conductive surface is disposed higher than said LED die, said conductive surface of said second lead frame portion constituting a top surface of said conductive portion.

9. The LED package structure as claimed in claim 6, wherein said top surface of said insulating housing has a rough portion surrounding said cavity of said insulating housing, said LED package structure further comprising an optical lens disposed on said top surface of said insulating housing for covering said encapsulating material and said rough portion of said insulating housing.

10. The LED package structure as claimed in claim 9, wherein said encapsulating material and said optical lens are made of the same material.

11. The LED package structure as claimed in claim 6, further comprising an optical lens disposed on said top surface of said insulating housing for covering said encapsulating material.

12. The LED package structure as claimed in claim 11, wherein said encapsulating material and said optical lens are made of the same material.

13. The LED package structure as claimed in claim 6, wherein said cavity of said insulating housing is defined by an inner surface, a distance between said LED die and said inner surface of said insulating housing being smaller than 0.6 mm.

14. The LED package structure as claimed in claim 6, wherein said encapsulating material includes fluorescent powders.

15. The LED package structure as claimed in claim 6, wherein said lead frame unit further includes:
- a pair of first side strips arranged in a first direction, aligned with and spaced apart from each other, and flanking said first lead frame portion and said second lead frame portion;
- a pair of second side strips arranged in a second direction different from the first direction, aligned with and spaced apart from each other, extending into said insulating housing, and flanking said first lead frame portion and said second lead frame portion, each of said second side strips being connected between said first side strips; and
- a plurality of connecting strips connecting said first lead frame portion and said second lead frame portion with said first side strips,
- whereby, after said insulating housing is molded on said lead frame unit, said connecting strips are removable from said lead frame unit.

* * * * *